United States Patent
Touyama et al.

(10) Patent No.: US 6,930,618 B2
(45) Date of Patent: Aug. 16, 2005

US006930618B2

(54) ENCODING METHOD AND APPARATUS, AND DECODING METHOD AND APPARATUS

(75) Inventors: Keisuke Touyama, Tokyo (JP); Shiro Suzuki, Kanagawa (JP); Minoru Tsuji, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/483,105

(22) PCT Filed: Apr. 30, 2003

(86) PCT No.: PCT/JP03/05546
§ 371 (c)(1),
(2), (4) Date: Jan. 7, 2004

(87) PCT Pub. No.: WO03/096545
PCT Pub. Date: Nov. 20, 2003

(65) Prior Publication Data
US 2004/0164882 A1 Aug. 26, 2004

(30) Foreign Application Priority Data
May 7, 2002 (JP) .................................... 2002-132189

(51) Int. Cl.[7] ............................................... H03M 7/38
(52) U.S. Cl. ........................... 341/51; 341/50; 341/65; 341/107; 348/402.1
(58) Field of Search ........................... 341/50, 51, 107, 341/65

(56) References Cited

U.S. PATENT DOCUMENTS

| 3,891,143 | A | * | 6/1975 | Haeusler | 235/437 |
| 4,862,167 | A | * | 8/1989 | Copeland, III | 341/107 |
| 5,337,087 | A | * | 8/1994 | Mishima | 375/240.04 |
| 5,606,421 | A | * | 2/1997 | Suzuki et al. | 386/33 |
| 5,835,030 | A | * | 11/1998 | Tsutsui et al. | 341/51 |
| 6,252,992 | B1 | * | 6/2001 | Ishikawa | 382/239 |
| 6,271,885 | B2 | * | 8/2001 | Sugiyama | 348/402.1 |
| 6,717,534 | B2 | * | 4/2004 | Yokose | 341/65 |

FOREIGN PATENT DOCUMENTS

| JP | 05-13414 | 5/1993 |
| JP | 08-316846 | 11/1996 |
| JP | 09-36752 | 2/1997 |
| JP | 11-8771 | 1/1999 |
| JP | 2002-27472 | 1/2002 |

* cited by examiner

Primary Examiner—Jean Bruner Jeanglaude
(74) Attorney, Agent, or Firm—Sonnenschein, Nath & Rosenthal LLP

(57) ABSTRACT

In an encoding apparatus (10), a code table group exchange judgment unit (12) selects a group of code tables from a plurality of groups of code tables according to the property such as tonality of a spectrum signal D11, and a quantization unit (15) encodes quantization coefficients using a code table included in the selected group. Then, a multiplexer (18) multiplexes a group index D12 together with coefficient data D17. Furthermore, in case resources for an encoder is small, and sound quality may have to be somewhat degraded so as to realize practical encoding speed, a code table number change judgment unit (17) changes or reduces the number of code tables to be used.

42 Claims, 10 Drawing Sheets

| quantization unit | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| code table index | 0 | 1 | 0 | 2 | 4 | 7 | 0 | 5 | 5 | 3 | 1 | 7 | 1 | 3 | 6 | 4 |
| spectrum bit number | 50 | 48 | 47 | 39 | 42 | 50 | 20 | 30 | 33 | 45 | 47 | 39 | 41 | 42 | 39 | 51 |
| code table bit number | 3 | 3 | 3 | 3 | 3 | 3 | 3 | 3 | 3 | 3 | 3 | 3 | 3 | 3 | 3 | 3 |

FIG.4

| quantization unit | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| code table | 0 | 0 | 2 | 3 | 0 | 5 | 7 | 0 | 6 | 1 | 0 | 1 | 1 | 0 | 0 | 1 |
| index for tone type signal | | | | | | | | | | | | | | | | |
| spectrum bit number | 50 | 49 | 48 | 30 | 40 | 44 | 18 | 28 | 29 | 48 | 48 | 39 | 40 | 42 | 38 | 39 |
| code table bit number | 3 | 3 | 3 | 3 | 3 | 3 | 3 | 3 | 3 | 3 | 3 | 3 | 3 | 3 | 3 | 3 |
| code table | 0 | 4 | 0 | 2 | 3 | 7 | 0 | 0 | 3 | 3 | 1 | 5 | 4 | 2 | 5 | 7 |
| index for noise type signal | | | | | | | | | | | | | | | | |
| spectrum bit number | 56 | 48 | 47 | 39 | 42 | 50 | 20 | 30 | 33 | 45 | 47 | 45 | 41 | 49 | 39 | 51 |
| code table bit number | 3 | 3 | 3 | 3 | 3 | 3 | 3 | 3 | 3 | 3 | 3 | 3 | 3 | 3 | 3 | 3 |

FIG.5

| quantization unit | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| code table index | 0 | 0 | 2 | 3 | 0 | 5 | 7 | 0 | 6 | 1 | 0 | 1 | 1 | 0 | 0 | 1 |
| spectrum bit number | 50 | 49 | 48 | 30 | 40 | 44 | 18 | 28 | 29 | 48 | 48 | 39 | 40 | 42 | 38 | 39 |
| code table bit number | 2 | 2 | 3 | 3 | 2 | 4 | 4 | 2 | 4 | 2 | 2 | 2 | 2 | 2 | 2 | 2 |

FIG.7

| quantization unit | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| code table index | 0 | 0 | 2 | 2 | 0 | 3 | 2 | 0 | 3 | 1 | 0 | 1 | 1 | 0 | 0 | 1 |
| spectrum bit number | 50 | 49 | 48 | 35 | 40 | 46 | 21 | 28 | 33 | 48 | 48 | 39 | 40 | 42 | 38 | 39 |
| code table bit number | 1 | 1 | 3 | 3 | 1 | 3 | 3 | 1 | 3 | 2 | 1 | 2 | 2 | 1 | 1 | 2 |

FIG.8

ENCODING METHOD AND APPARATUS, AND DECODING METHOD AND APPARATUS

This application is the national phase under 35 U.S.C. 371 of PCT International No. PCT/JP03/05546, which has an International filing, date of Apr. 30, 2003 which claims priority based on a Japan Application No. 2002-132189 filed on May 7, 2002.

BACKGROUND OF THE INVENTION

The present invention relates to an encoding method and apparatus, a decoding method and apparatus, a program, and a recording medium, in particular, to an encoding method and apparatus for encoding digital data of acoustic signals or sound signals with high efficiency to transmit thus encoded data or record thus encoded data to a recording medium, to a decoding method and apparatus for receiving or reproducing encoded data to decode thus received or reproduced encoded data, to a program for making a computer carry out the encoding processing and the decoding processing, and to a recording medium having recorded therein the program which can be read out by a computer.

This application claims priority of Japanese Patent Application No. 2002-132189, filed on May 7, 2002, the entirety of which is incorporated by reference herein.

Conventionally, as methods for encoding audio signals of sound signals, etc. with high efficiency, there are known non-blocking frequency band division systems, such as the band division encoding (subband coding), and blocking frequency band division systems, such as the conversion encoding.

In the non-blocking frequency band division systems, an audio signal on time base are divided into a plurality of frequency bands without blocking the signal, and thus divided signal is encoded. On the other hand, in the blocking frequency band division systems, a signal on time base is converted to a signal on frequency base (spectrum conversion), and thus converted signal is divided into a plurality of frequency bands. Then, coefficients obtained through the spectrum conversion are put together according to predetermined respective frequency bands, and thus divided signal is encoded in respective bands.

Furthermore, as a method to improve efficiency of encoding, there is suggested a high-efficient encoding method which jointly introduces the non-blocking frequency band division system and the blocking frequency band division system. Employing this method, after performing band division employing band division encoding, a signal divided into respective bands is converted to a signal on frequency base through spectrum conversion, and thus converted signal is encoded in the respective bands.

In performing frequency band division, the QMF (Quadrature Mirror Filter) may be used in many cases since signals can be processed simply and aliasing distortions can be removed. Details of frequency band division by the QMF are written in "1976R. E. Crochiere, Digital coding of speech in subbands, Bell Syst. Tech.J.Vol.55, No.8 1976".

Furthermore, as a method to perform band division, there is known the PQF (Polyphase Quadrature Filter) which is a filter division method with equalized bandwidths. Details of the PQF are written in "ICASSP 83 BOSTON, Polyphase Quadrature Filters—A new subband coding technique, Joseph H. Rothweiler".

On the other hand, as above-described spectrum conversion, for example, an input audio signal is blocked using a frame of predetermined unit time, and the signal on time base is converted to a signal on frequency base by undergoing the DFT (Discrete Fourier Transformation), DCT (Discrete Cosine Transformation), MDCT (Modified Discrete Cosine Transformation) in respective blocks.

Details of the MDCT are written in "ICASSP 1987, Subband/Transform Coding Using Filter Bank Designs Based on Time Domain Aliasing Cancellation, J. P. Prince, A. B. Bradley, Univ. of Surrey Royal Melbourne Inst. of Tech."

By quantizing a signal divided into respective bands which is obtained through the filter and spectrum conversion, bands which raise quantization noise can be controlled, which enables high-efficient encoding in auditory sense by utilizing property of masking effect, etc. Furthermore, prior to quantization, signal components of respective bands are normalized by the maximum of absolute values of signal components of each band, which enables more high-efficient encoding.

Bandwidths of respective frequency bands in performing band division are determined in view of human auditory property. That is, in general, an audio signal may be divided into a plurality of bands (for example, 32 bands) under critical bands in which higher bands are of broader bandwidth.

In encoding data in respective bands, bit allocation is performed to allocate predetermined bits or adaptable bits to respective bands. That is, in encoding coefficient data, obtained through the MDCT processing, by employing bit allocation, the numbers of bits are adaptably allocated to MDCT coefficient data of respective bands that are obtained by performing the MDCT processing for a signal blocked into respective blocks.

As bit allocation methods, there are known a method of performing bit allocation based on signal amount of respective bands (properly referred to as a first bit allocation method, hereinafter), and a method of performing bit allocation fixedly, in which signal-to-noise ratios necessary for respective bands are obtained by utilizing auditory masking (properly referred to as a second bit allocation method, hereinafter).

Details of the first bit allocation method are written in "Adaptive Transform Coding of Speech Signals, R. Zelinski and P. Noll, IEEE Transactions of Accoustics, Speech and Signal Processing, vol.ASSP-25, No.4, August 1977".

Details of the second bit allocation method are written in "ICASSP 1980, The critical band coder digital encoding of the perceptual requirements of the auditory system, M. A. Kransner MIT".

Employing the first bit allocation method, quantization noise spectrums are planarized, minimizing noise energy. However, since masking effect is not utilized in auditory sense, actual auditory noise level is not optimized. On the other hand, employing the second bit allocation method, in case energy is concentrated on a specific frequency, for example, even though a sinusoidal wave is input, since bit allocation is performed fixedly, desirable property value cannot be obtained.

So, there is suggested a high-efficient encoding apparatus which divides entire bits, which are to be used in bit allocation, into bits for fixed bit allocation patterns which are determined in advance for respective small blocks and bits for bit allocation which depend on signal amount of respective blocks, and causes the division ration to depend on a signal related with an input signal. That is, for example, when spectrums of a signal are smooth, division proportion for the fixed bit allocation patterns is enhanced.

Employing this method, in case energy is concentrated on a specific spectrum when inputting a sinusoidal wave, many bits are allocated to a block including the spectrum, which can improve the whole signal-to-noise ratio significantly. In general, since human auditory is extremely sensitive to a signal having a steep spectrum component, above-described improvement of signal-to-noise ratio not only improves measurement numerical value but also improves quality of sound in auditory sense effectively.

As methods of bit allocation, there are suggested many other methods other than above-described methods, and models concerning auditory are becoming refined. Improvement in operational capability of an encoding apparatus enables high-efficient encoding from an auditory point of view.

In case of employing the DFT or the DCT as a method to convert a waveform signal to spectrums, when converting the signal using time blocks composed of M sets of samples, M sets of independent real number data can be obtained. Generally, in order to reduce connection distortions between time blocks (frames), each block is overlapped with both neighbouring blocks by predetermined M1 sets of samples respectively. Thus, when employing an encoding method utilizing the DFT or the DCT, M sets of real number data are quantized to be encoded for (M-M1) sets of samples on the average.

In case of employing the MDCT as a method to convert a signal on time base to spectrums, M sets of independent real number data can be obtained from 2M sets of samples with each block overlapped with both neighbouring blocks by M sets of samples respectively. Thus, in this case, M sets of real number data are quantized to be encoded for M sets of samples on the average. Then, a decoding apparatus regenerate a waveform signal from codes obtained in above-described method that utilizes the MDCT by adding waveform components obtained from respective blocks through inverse conversion with the respective waveform components interfering with each other.

In general, by making time blocks (frames) for conversion longer, frequency resolution of spectrums is enhanced and energy is concentrated on a specific spectrum component. In case of using the MDCT, in which a signal is converted using long blocks with each block overlapped with both neighbouring blocks by half and the number of obtained spectrums does not increase from the number of original time samples, it becomes possible to realize high-efficient encoding as compared with the case using the DFT or the DCT. Furthermore, by making adjacent blocks have properly long overlaps, distortions between blocks of a waveform signal can be reduced.

In generating an actual code sequence, firstly, quantization accuracy information indicative of a quantization step used to perform quantization and normalization coefficient information indicative of a coefficient used to normalize respective signal components are encoded with predetermined number of bits for respective bands in which normalization and quantization are to be performed. Then normalized and quantized spectrums are encoded.

There is written a high-efficient encoding method in "IDO/IEC 11172-3:1993(E), 1993", in which the numbers of bits indicative of quantization accuracy information are set to be different from band to band. According to the method, it is prescribed that higher bands are small in the number of bits indicative of quantization accuracy information.

In encoding spectrums, there is known the variable codeword length coding method such as the Huffman coding. Details of the Huffman coding are written in "David A. Huffman, "A Method for the Construction of Minimum—Redundancy Codes", Proceedings of the I.R.E., pp1098–1101, September 1952".

In general, it becomes possible to improve compression efficiency of spectrums when plural kinds of code tables are prepared and proper tables are employed by exchanging them, as compared with the case employing a single Huffman code table alone, since optimum code tables can be used for various input signals.

However, in case of encoding code table indexes indicative of used code tables in respective quantization units, the number of encoding bits of the indexes is undesirably increased since the number of code tables is increased.

For example, it is assumed that the number of quantization units is 16, and indexes are encoded in respective quantization units. In case the number of code tables is 4 (2 bits), the number of encoding bits of the indexes is 32 (=2 bits×16 units). On the other hand, in case the number of code tables is 8 (3 bits), the number of encoding bits of the indexes is undesirably increased to be 48 (=3 bits×16 units). Thus, in case the total number of bits is fixed, the number of bits to encode spectrum information is decreased by 16 (48 bits−32 bits). There is raised no problem in case compression ratio is enhanced by more than a value corresponding to 16 bits due to increase of the number of code tables, while in case compression ratio is not enhanced, the whole compression ratio is undesirably lowered.

That is, in case the number of code tables is increased, compression ratio of spectrum information itself is enhanced, while the whole compression ratio is not necessarily enhanced since the number of encoding bits of indexes of code tables is increased.

SUMMARY OF THE INVENTION

Accordingly, the present invention has an object to overcome the above-mentioned drawbacks of the prior art by providing an encoding method and apparatus, a decoding method and apparatus for receiving or reproducing encoded data to decode thus received or reproduced encoded data, a program for making a computer carry out the encoding processing and the decoding processing, and a recording medium having recorded therein the program which can be read out by a computer, which can select optimum code tables according to signal property of various input signals without lowering the whole compression ratio.

The above object can be attained by providing an encoding method and apparatus for encoding a digital signal using a single code table in respective predetermined units, which selects a single group of code tables from a plurality of groups of code tables classified in advance according to the property of the digital signal, determines a single code table from a group of code tables selected in the selection processing, and encodes the digital signal using a code table determined in the determination processing.

In selecting a single group of code tables, a group of code tables is selected according to tonality of the digital signal.

Also, the above object can be attained by providing an encoding method and apparatus for encoding a digital signal using a single code table in respective predetermined units, which sets up the number of selectable code tables included in a group of code tables, selects a single code table from a group of code tables, and encodes the digital signal using a code table selected in the selection processing.

Also, the above object can be attained by providing a decoding method and apparatus for decoding a digital signal that has been encoded using a single code table in respective predetermined units, which selects a single group of code tables to be used from a plurality of groups of code tables classified in advance, determines a single code table to be used from a group of code tables selected in the selection processing, and decodes the digital signal using a code table determined in the determination processing.

In selecting a single group of code tables, a group of code tables, being the same as what has been selected according to tonality of the digital signal in encoding the digital signal, is selected.

Also, the above object can be attained by providing a decoding method and apparatus for decoding a digital signal that has been encoded using a single code table in respective predetermined units, which sets up the number of code tables included in a group of code tables, selects a single code table from a group of code tables, and decodes the digital signal based on a code table selected in the selection processing.

Also the above object can be attained by providing a program for making a computer carry out above-described encoding processing and decoding processing, and a recording medium having recorded therein the program which can be read out by a computer.

These objects and other objects, features and advantages of the present invention will become more apparent from the following detailed description of the preferred embodiments of the present invention.

BRIEF DESCRIPTION OF THE DRAWINGS

FIG. 1A shows a spectrum of a tone type signal, while

FIG. 4 shows the numbers of encoding bits of indexes and spectrum in the case in which conventional code tables are used.

FIG. 5 shows the numbers of encoding bits of indexes and spectrum in the case in which code tables employing the present invention are used.

FIG. 7 shows the numbers of encoding bits of indexes and spectrum in the case in which the Huffman coding is employed in encoding indexes of code tables.

FIG. 8 shows the numbers of encoding bits of indexes and spectrum in the case in which the Huffman coding is employed in encoding indexes of code tables and the number of code tables is 4.

DETAILED DESCRIPTION OF THE PRESENTLY PREFERRED EMBODIMENTS

The present invention will further be described below concerning the best modes for carrying out the present invention with reference to the accompanying drawings. The present invention is adapted to the following embodiments of the encoding method and apparatus for encoding digital data of audio signals with high efficiency to transmit thus encoded data or record thus encoded data to a recording medium, and of the decoding method and apparatus for receiving or reproducing encoded data to decode thus received or reproduced encoded data. Firstly, basic principle of the present invention will be explained, and then the encoding apparatus and the decoding apparatus employing the present invention will be explained.

Figure 1A:
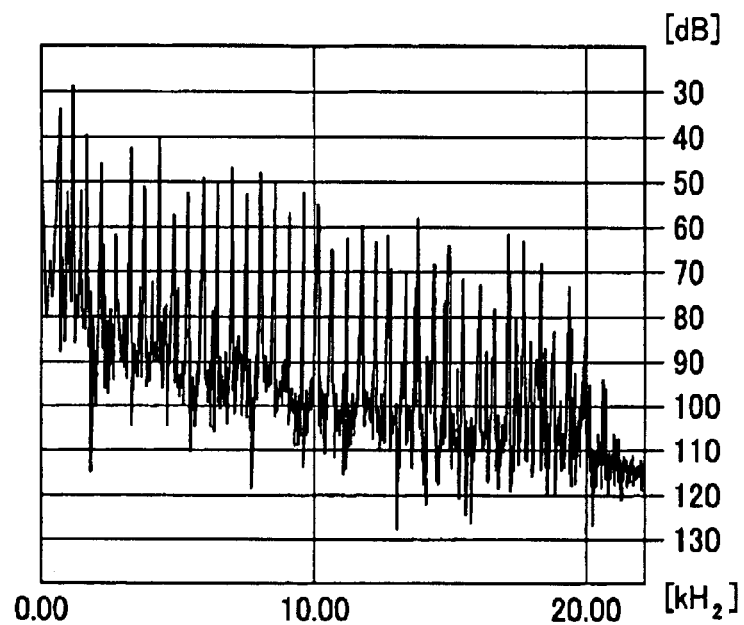
Figure 1B:
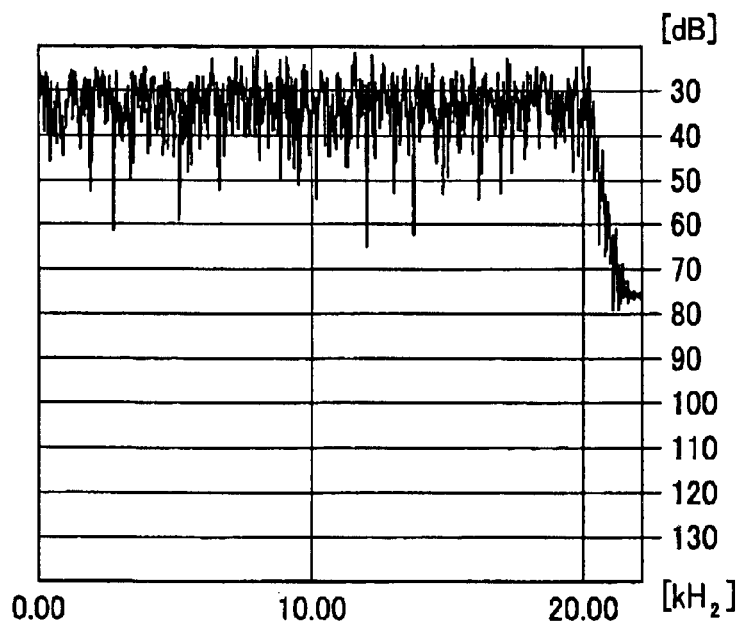
FIG. 1B shows a spectrum of a noise type signal.

In general, acoustic signals (audio signals) can be classified broadly into two signal patterns, that is, signals of tone type and those of noise type. FIG. 1A shows a spectrum of a tone type signal, while FIG. 1B shows a spectrum of a noise type signal. As can be seen from FIG. 1A and FIG. 1B, since forms of spectrums or signals that have undergone frequency conversion are widely different between a tone type signal and a noise type signal, appearance probabilities of quantization coefficients are also widely different between them.

In case of a tone type signal, since the probability that quantization coefficients (spectrum coefficients after quantization) become "0" is high, a Huffman code of short codeword length such as "1" bit are allocated to codes corresponding to "0", which can realize high compression ratio. On the other hand, in case of a noise type signal, since respective values of a quantized spectrum appear with approximately similar probabilities, it is desirable that Huffman codes of similar codeword length be allocated to the respective values.

Table 1 and Table 2 show examples of Huffman code tables for a tone type signal and a noise type signal, respectively. In the following explanation, values of quantization coefficients range from −3 to +3.

TABLE 1

| Values of quantized spectrum | Huffman codes | codeword lengths |
| --- | --- | --- |
| −3 | 1110 | 4 |
| −2 | 1100 | 4 |
| −1 | 100 | 3 |
| 0 | 0 | 1 |
| 1 | 101 | 3 |
| 2 | 1101 | 4 |
| 3 | 1111 | 4 |

TABLE 2

| Values of quantized spectrum | Huffman codes | codeword lengths |
| --- | --- | --- |
| −3 | 110 | 3 |
| −2 | 100 | 3 |
| −1 | 010 | 3 |
| 0 | 00 | 2 |
| 1 | 011 | 3 |
| 2 | 101 | 3 |
| 3 | 111 | 3 |

Figure 2:
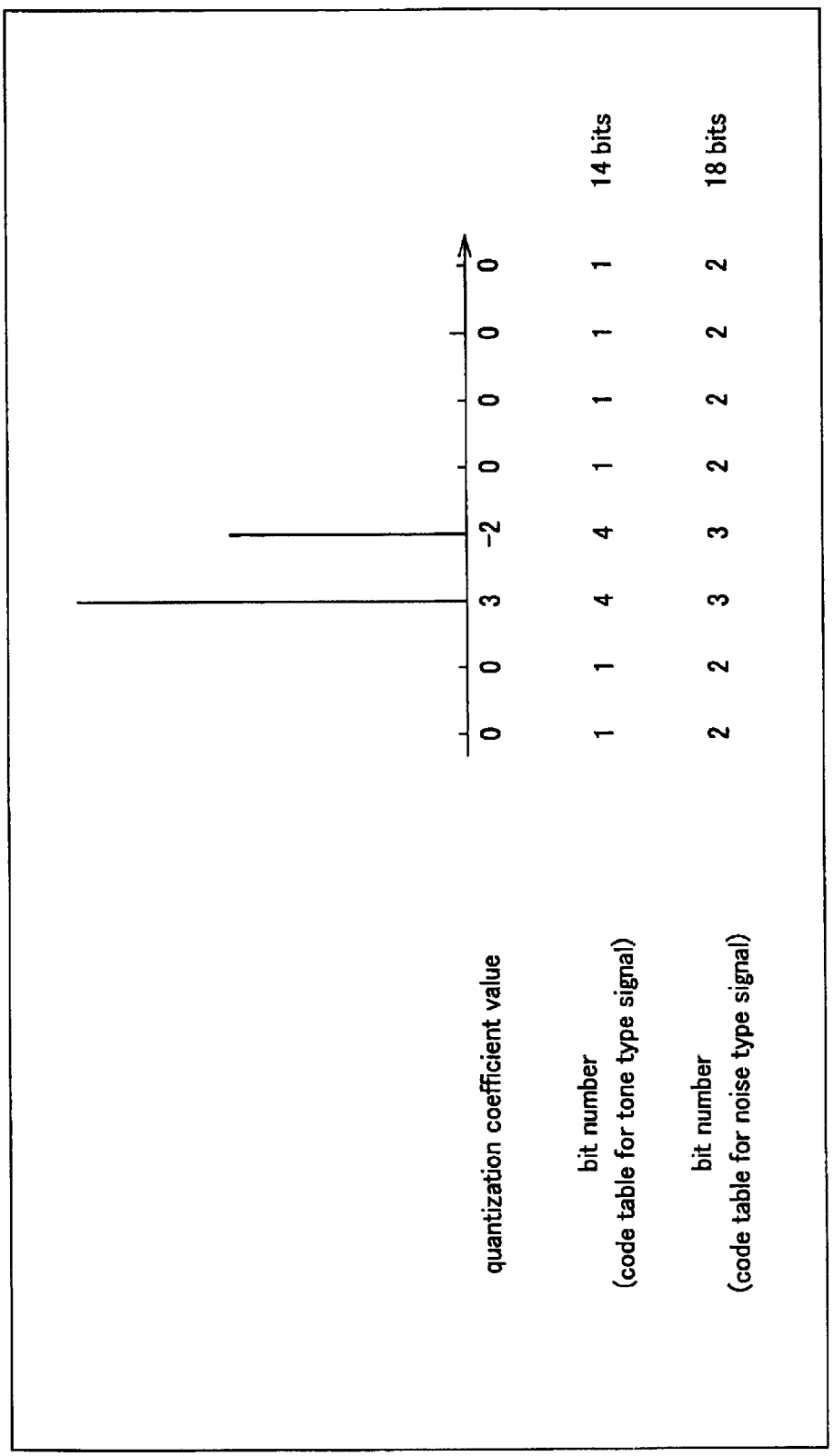
FIG. 2 shows a view for explaining a specific example of encoding a tone type signal spectrum.

FIG. 2 shows a view for explaining a specific example of encoding a tone type signal spectrum using the code tables shown in Table 1 and Table 2. As shown in FIG. 2, quantization coefficients appear with values of 0, 0, 3, −2, 0, 0, 0, 0 in this order. When encoding the values using the code table for a tone type signal shown in Table 1, codeword lengths of encoded values come into 1, 1, 4, 4, 1, 1, 1, 1 in this order, and the sum thereof comes into 14 bits. On the other hand, when encoding the values using the code table for a noise type signal shown in Table 2, codeword lengths of encoded values come into 2, 2, 3, 3, 2, 2, 2, 2 in this order, and the sum thereof comes into 18 bits. That is, when encoding a tone type signal spectrum, in case of using the code table for a tone type signal, encoding can be performed with smaller number of bits, in this case smaller by 4 bits, as compared with the case using the code table for a noise type signal.

Figure 3:
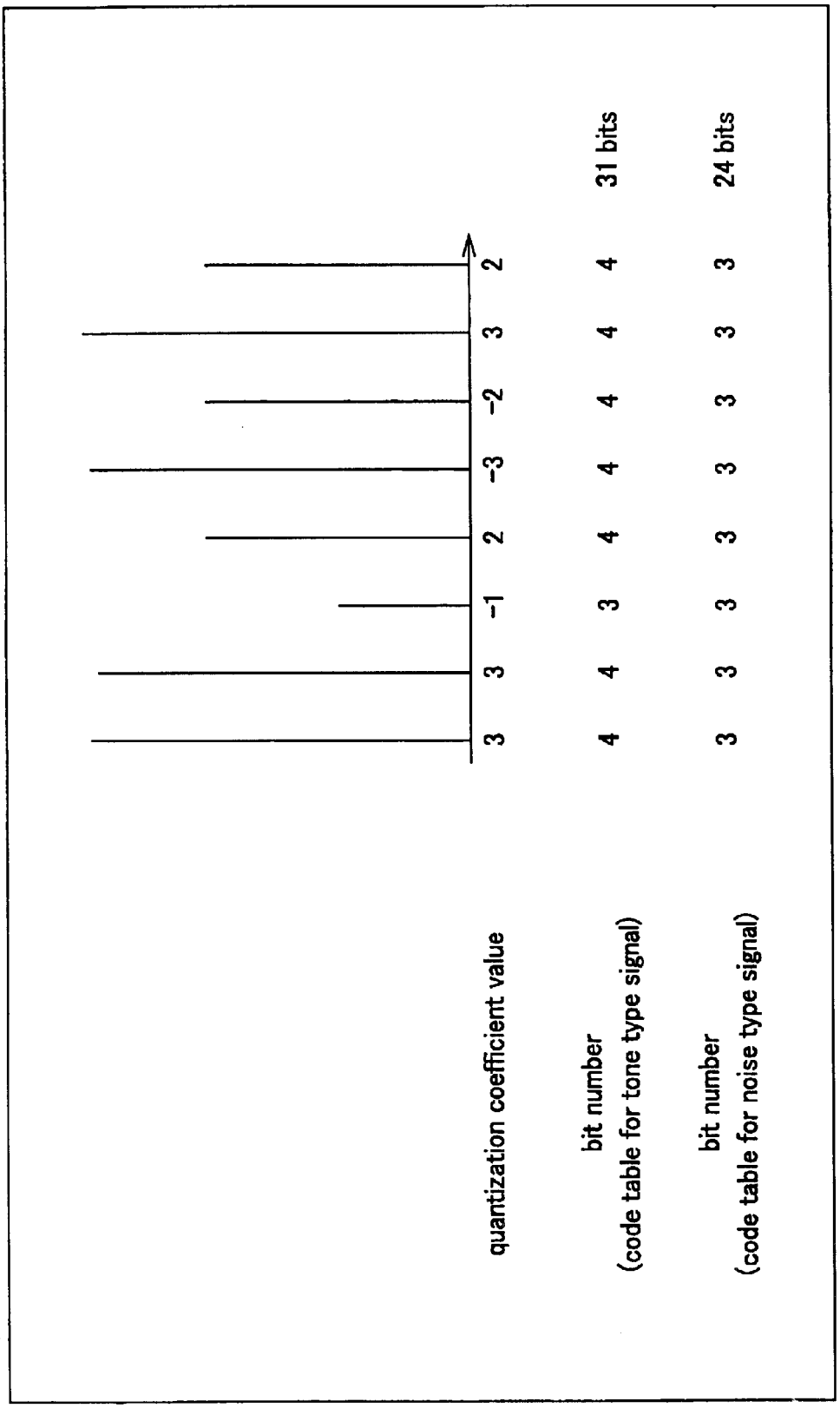
FIG. 3 shows a view for explaining a specific example of encoding a noise type signal spectrum.

Similarly, FIG. 3 shows a view for explaining a specific example of encoding a noise type signal spectrum using the code tables shown in Table 1 and Table 2. As shown in FIG. 3, quantization coefficients appear with values of 3, 3, −1, 2, −3, −2, 3, 2 in this order. When encoding the values using the code table for a tone type signal shown in Table 1, codeword lengths of encoded values come into 4, 4, 3, 4, 4, 4, 4, 4 in this order, and the sum thereof comes into 31 bits. On the other hand, when encoding the values using the code table for a noise type signal shown in Table 2, codeword lengths of encoded values come into 3, 3, 3, 3, 3, 3, 3, 3 in this order, and the sum thereof comes into 24 bits. That is, when encoding a noise type signal spectrum, in case of using the code table for a noise type signal, encoding can be performed with smaller number of bits, in this case smaller by 7 bits, as compared with the case using the code table for a tone type signal.

Thus, in encoding quantization coefficients using Huffman code tables, high compression ratio can be realized by not using a common code table for all input signals but by using optimum code tables from previously prepared code tables according to signal property, such as tone type or noise type, of various input signals.

In general, as for acoustic signals, there can be seen few cases in which tone type signal components and noise type signal components are microscopically mixed up in respective bands. In most cases, signals in all bands are of tone type or of noise type all together, or tone type and noise type change at low frequency bands and at high frequency bands.

In this embodiment, as will be explained hereinafter, both groups of code tables for a tone type signal and groups of code tables for a noise type signal are prepared, and proper tables are employed by exchanging them according to signal property of various input signals so as to improve encoding efficiency.

For example, it is assumed that the number of quantization units is 16. In the conventional method, since code tables are not exchanged, when the number of code tables is 8, the number of bits to encode indexes of the code tables comes into 48 (3×16). On the other hand, when 8 code tables for a tone type signal and 8 code tables for a noise type signal are prepared respectively and the tables are exchanged in respective bands, since the number of exchange bit is "1" and the number of encoding bits of the code tables is 48, the sum comes into 49. In the latter case, even though the number of bits is increased by "1" as compared with the case in which code tables are not exchanged, since the number of the code tables is substantially doubled, compression ratio of spectrum information is enhanced and thus the whole compression ratio is improved.

Specifically, the numbers of encoding bits etc. in the case in which conventional code tables are used and the numbers of encoding bits etc. in the case employing the present invention in which code tables are classified into those for a tone type signal and those for a noise type signal and any of the tables is selected to be used are compared using FIG. 4 and FIG. 5.

FIG. 4 shows the numbers of encoding bits etc. in the case in which conventional code tables are used. In this example, indexes of the code tables for respective quantization units are selected from 0 to 7, that is 8 (3 bits) in all, and the numbers of bits of spectrums encoded using the code tables are shown. Since respective code tables are shown by 3 bits and the number of quantization units is 16, the sum of the numbers of bits of the code tables comes into 48. The sum of the numbers of encoding bits of the spectrums comes into 663. Thus, the total sum of these bits comes into 711.

FIG. 5 shows the numbers of encoding bits etc. in the case employing the present invention in which code tables are classified into groups of those for a tone type signal and groups of those for a noise type signal and any of the tables is selected to be used. In this example, 8 code tables for a tone type signal and 8 code tables for a noise type signal are prepared respectively. Since indexes of the code tables are shown by 3 bits from 0 to 7, the sum of the numbers of bits of the code tables comes into 48. On the other hand, exchange bit of "1" bit is required to exchange code tables according to tone type and noise type. So, the sum of the numbers of encoding bits of the code tables comes into 49. The sum of the numbers of encoding bits of the spectrums using code tables for a tone type signal comes into 640, and the sum of the numbers of encoding bits of the spectrums using code tables for a noise type signal comes into 682. Thus, in this case, spectrums can be compressed efficiently when code tables for a tone type signal are used. When code tables for a tone type signal are used, the total sum of these bits comes into 689 which number is smaller than that of the case shown in FIG. 4 by 22 bits. By reallocating the 22 bits to spectrums, sound quality can be further improved.

As can be seen from FIG. 5, the sum of the numbers of encoding bits of the spectrums becomes small as compared with the case shown in FIG. 4. This is because the number of code tables is increased and various signals can be coped with accordingly, and compression efficiency of spectrums can be improved.

The probabilities under which respective code tables are actually selected, which depend on also the manner of learning of the code tables, are not equal and unequally distribute. By employing variable codeword length coding adaptable to the unequal distribution, indexes of code tables can also be encoded efficiently.

Figure 6:
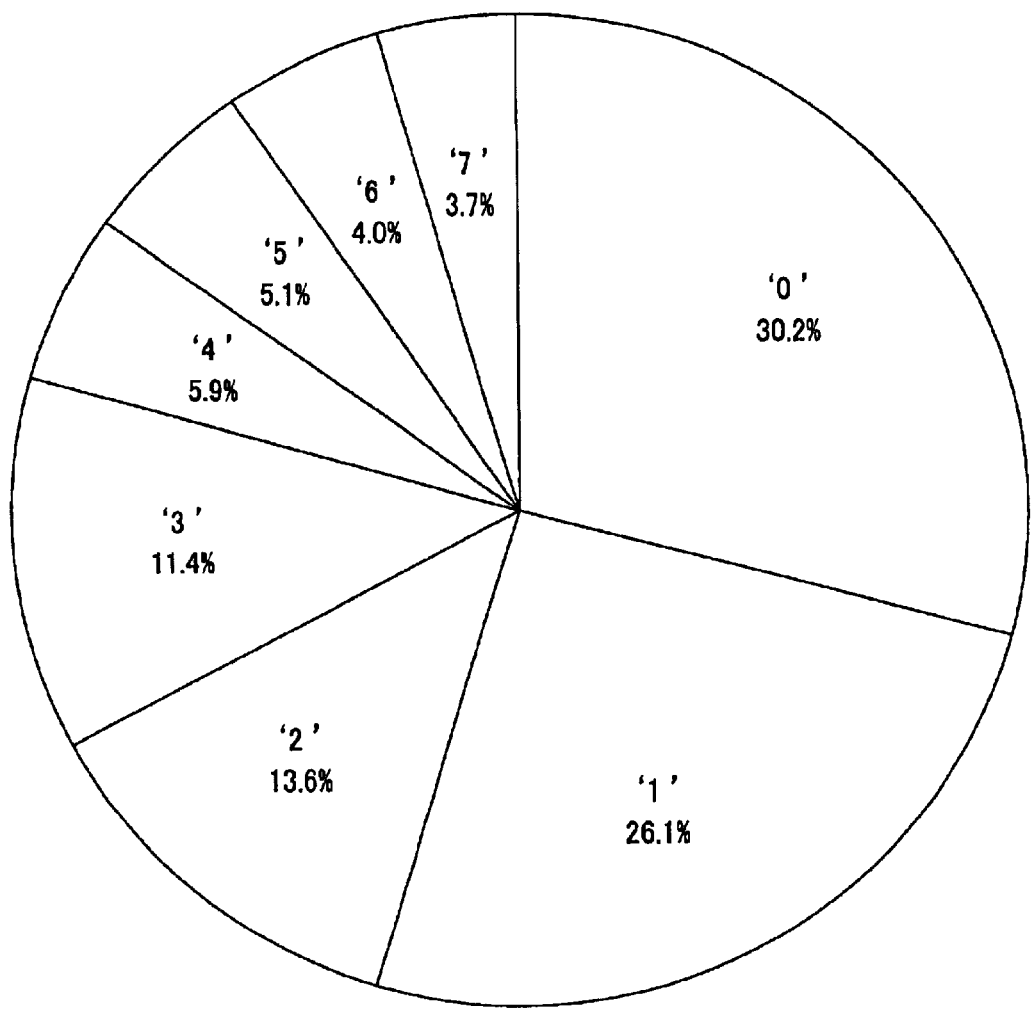
FIG. 6 shows an example of selection probabilities of respective code tables.

FIG. 6 shows an example of selection probabilities of respective code tables. As can be seen from FIG. 6, selection probabilities of respective code tables are not equal. Table 3 shows an example of variable codes that is formed in view of the unequal distribution so that encoding efficiently of indexes is optimized. The code tables shown in Table 3 are optimized for a tone type signal.

TABLE 3

| Indexes of code tables | variable codes | codeword lengths |
| --- | --- | --- |
| 0 | 00 | 2 |
| 1 | 01 | 2 |
| 2 | 100 | 3 |
| 3 | 101 | 3 |
| 4 | 1100 | 4 |
| 5 | 1101 | 4 |
| 6 | 1110 | 4 |
| 7 | 1111 | 4 |

FIG. 7 shows the numbers of encoding bits etc. in the case employing the variable codes shown in Table 3, which corresponds to the embodiment shown in FIG. 5. As can be seen from FIG. 7, by employing the variable codes in encoding the indexes of the code tables, the number of encoding bits of the indexes of the code tables comes into 40 which number is smaller than that of the case shown FIG. 5 by 8 bits. By reallocating the 8 bits to spectrums, sound quality can be further improved.

In case of a hardware apparatus, etc., since resources for an encoder is small, sound quality may have to be somewhat degraded so as to realize practical coding speed. In this case, as will be explained hereinafter, high speed encoding can be realized by reducing the number of code tables that are to be actually used in encoding. The number of code tables should be reduced not simply but so that code tables of high selection probability are left intact, which can suppress deterioration of encoding efficiency. This set-up operation may be performed by the user of an encoder, or may be performed by the encoder side by judging the state of resources for an encoder or processing speed thereof.

Specifically, the case using 4 code tables will be explained. In case of the selection probabilities shown in FIG. 6, since 4 code tables with higher probabilities occupy 80% of the whole, 80% of spectrums can be encoded without lowering compression ratio.

Furthermore, since the number of code tables is reduced to be 4, the number of encoding bits to encode indexes of code tables can also be reduced as compared with the case using 8 code tables. Table 4 shows an example of variable codes for indexes of Huffman code tables using 4 code tables.

TABLE 4

| Indexes of code tables | variable codes | codeword lengths |
| --- | --- | --- |
| 0 | 0 | 1 |
| 1 | 10 | 2 |
| 2 | 110 | 3 |
| 3 | 111 | 3 |

FIG. 8 shows the numbers of encoding bits etc. in the case employing the variable codes shown in Table 4, which corresponds to the embodiment shown in FIG. 7. Since the number of code tables is 4, the quantization units 3, 5, 6, 8 cannot select code tables which encode spectrums with the least number of bits, and thus the number of encoding bits of spectrums is somewhat increased. On the other hand, since 4 code tables with higher probabilities are used and the 4 code tables occupy 80% of the whole as shown in FIG. 6, these situations occupy 20% of the whole.

Furthermore, since the number of code tables itself is reduced, it is expected that the number of bits to encode indexes of code tables will be reduced. In the example shown in FIG. 8, the number of encoding bits of indexes of code tables comes into 30 which number is smaller than that of the case shown in FIG. 7 by 10 bits.

In above-described embodiment, in case the number of code tables for encoding processing is changed from 8 to 4, 4 code tables with higher probabilities are selected. On the other hand, the selection manner is not restricted to this, and code tables to be selected may be determined by the encoding side and the decoding side in advance.

Figure 9:
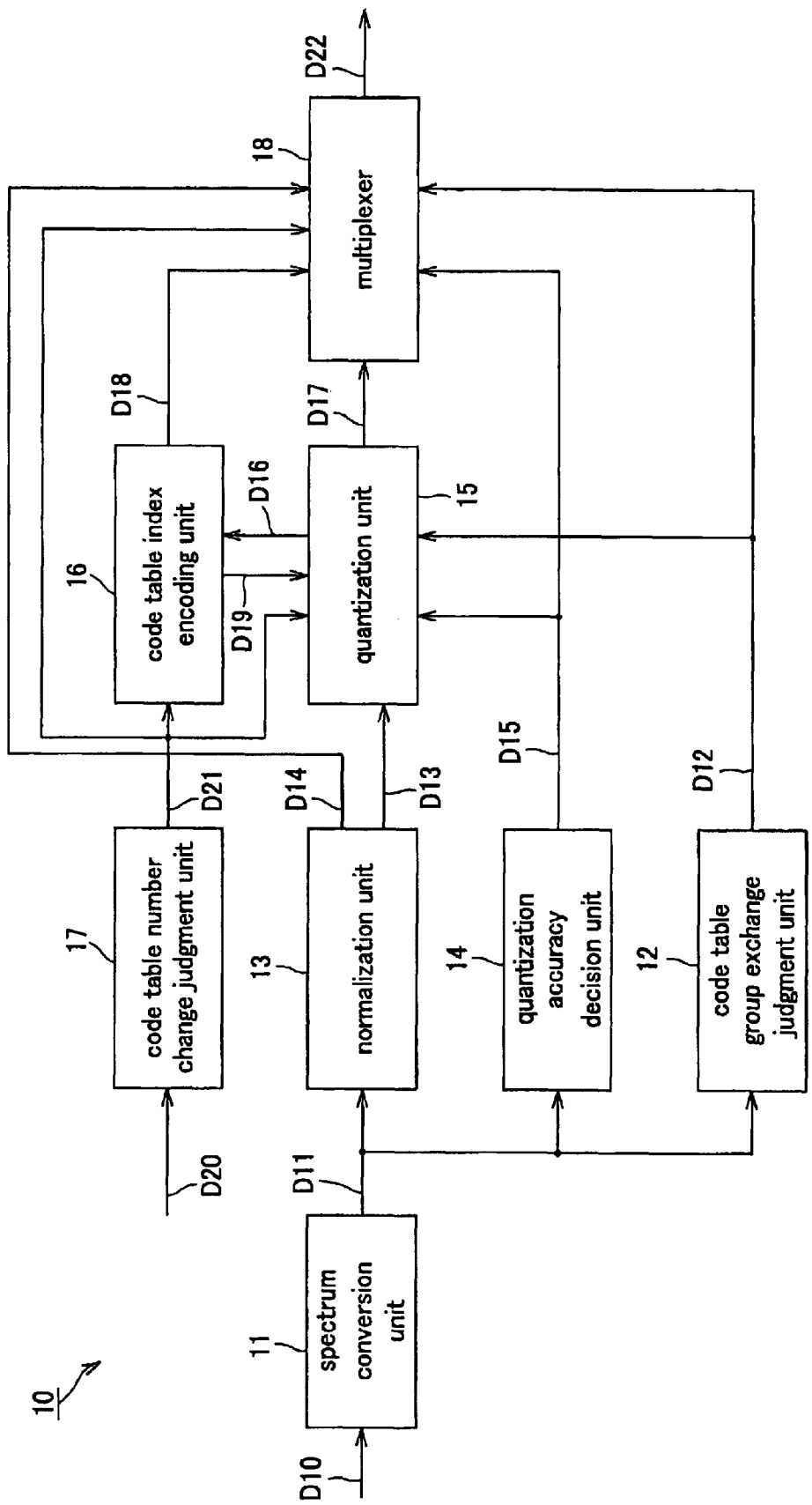
FIG. 9 shows a block diagram of the encoding apparatus according to the present invention.

Next, the configuration of the encoding apparatus and the decoding apparatus employing the present invention will be explained. FIG. 9 shows a block diagram of an encoding apparatus 10 according to the present invention, which includes a spectrum conversion unit 11, a code table group exchange judgment unit 12, a normalization unit 13, a quantization accuracy decision unit 14, a quantization unit 15, a code table index encoding unit 16, a code table number change judgment unit 17, and a multiplexer 18.

The spectrum conversion unit 11 receives an audio signal D10 to be encoded, and performs spectrum conversion such as the MDCT (Modified Discrete Cosine Transformation) for the audio signal D10 to convert the signal on time base to a spectrum signal D11 on frequency base. Then, the spectrum conversion unit 11 sends the spectrum signal D11 to the code table group exchange judgment unit 12, to the normalization unit 13, and to the quantization accuracy decision unit 14 for respective predetermined time blocks (frames).

The code table group exchange judgment unit 12 selects a group of code tables from a plurality of groups of code tables according to the property such as tonality of the spectrum signal D11 sent from the spectrum conversion unit 11, and sends a group index D12 indicative of thus selected group to the quantization unit 15 as well as to the multiplexer 18.

For example, as described above, in case code tables are classified into groups of those for a tone type signal and groups of those for a noise type signal, the code table group exchange judgment unit 12 checks tonality of the spectrum signal D11, and selects a code table for a tone type signal when the tonality is larger than a predetermined threshold, while selecting a code table for a noise type signal when the tonality is smaller than the threshold. Then, the code table group exchange judgment unit 12 sends the group index D12 indicative of the selected group to the quantization unit 15 as well as to the multiplexer 18 as "1" bit information for respective channels. On the other hand, judgement of tone type or noise type may be performed for respective divided frequency bands independently to send "1" bit information for the respective bands as the group index D12.

The normalization unit 13 extracts a signal component of maximum absolute value from respective signal components constituting the spectrum signal D11, and sets a coefficient corresponding to thus extracted signal component to be a normalization coefficient D14. Then, the normalization unit 13 normalizes or divides the respective signal components constituting the spectrum signal D11 using a value corresponding to the normalization coefficient D14. Thus, in this case, normalized data D13 obtained through the normalization ranges from −1.0 to 1.0. The normalization unit 13 sends the normalized data D13 to the quantization unit 15, while sending the normalization coefficient D14 to the multiplexer 18. The normalization unit 13 may send the normalization coefficient D14 to the multiplexer 18 after performing predetermined encoding processing for the normalization coefficient D14 if necessary.

The quantization accuracy decision unit 14 decides a quantization step to be used in quantizing the normalized data D13 based on the spectrum signal D11 sent from the spectrum conversion unit 11. Then, the quantization accuracy decision unit 14 sends quantization accuracy information D15 corresponding to thus decided quantization step to the quantization unit 15 as well as to the multiplexer 18. The quantization accuracy decision unit 14 may send the quantization accuracy information D15 to the multiplexer 18 after performing predetermined encoding processing for the quantization accuracy information D15 if necessary.

The quantization unit 15 quantizes the normalized data D13 using the quantization step corresponding to the quantization accuracy information D15 sent from the quantization accuracy decision unit 14. Then, the quantization unit 15 encodes quantization coefficients using a code table of the selected group based on the group index D12 sent from the code table group exchange judgment unit 12. Specifically, quantization coefficients are encoded actually using code tables of the selected group, then a code table which requires the least number of bits is determined as the code table to be used for encoding. The quantization unit 15 sends a code table index D16 of thus determined code table to the code table index encoding unit 16, while sending encoded coefficient data D17 to the multiplexer 18.

The code table index encoding unit 16 encodes the code table index D16 sent from the quantization unit 15, and sends encoded code table index D18 to the multiplexer 18. As has been described hereinbefore, when encoding indexes of code tables, the number of encoding bits can be reduced in case of employing the variable codeword length coding according to selection probabilities of respective code tables as compared with the case employing the fixed codeword length coding. Thus, in this case, the code table index encoding unit 16 sends encoding bit number information D19 of indexes of code tables to the quantization unit 15. Thus, the quantization unit 15 can reallocate the number of bits gained through encoding of indexes to spectrums.

The code table number change judgment unit 17 changes the number of code tables to be used out of the number of code tables included in the selected group, and sends a code table number index D21 to the quantization unit 15, to the code table index encoding unit 16, and to the multiplexer 18 for respective frames or respective bit streams as "1" bit information. As has been described above, in case resources for an encoder is small, and sound quality may have to be somewhat degraded so as to realize practical encoding speed, high speed encoding can be realized by reducing the number of code tables that are to be actually used for encoding. The number of code tables to be used may be changed based on a predetermined setting signal D20 sent from outside by judgment of the user or an apparatus itself, or other methods may be employed.

For example, as described above, in case of changing the number of code tables to be used from 8 to 4, the code table number change judgment unit 17 sends the code table number index D21 of "1" bit to the quantization unit 15, to the code table index encoding unit 16, and to the multiplexer 18. The quantization unit 15 actually performs encoding using predetermined 4 code tables out of 8 code tables, then determines a code table which requires the least number of bits as the code table used for encoding. The quantization unit 15 sends the code table index D16 of the determined code table to the code table index encoding unit 16. On the other hand, the code table index encoding unit 16 rearranges indexes of the predetermined 4 code tables, and encodes new indexes corresponding to the code table index D16 sent from the quantization unit 15.

The multiplexer 18 multiplexes the coefficient data D17 sent from the quantization unit 15 together with the group index D12, normalization coefficient D14, quantization accuracy information D15, code table index D18, and code table number index D21. Then, the multiplexer 18 transmits encoded data D22 obtained through multiplex processing via a transmission line, or records the encoded data D22 to a recording medium, not shown.

In the example, the code table group exchange judgment unit 12 checks tonality of the spectrum signal D11 to select either of a code table for a tone type signal or a code table for a noise type signal. On the other hand, the selection manner is not restricted to this. That is, required number of bits may be calculated by actually performing encoding using both code tables to select a group with smaller number of bits.

Figure 10:
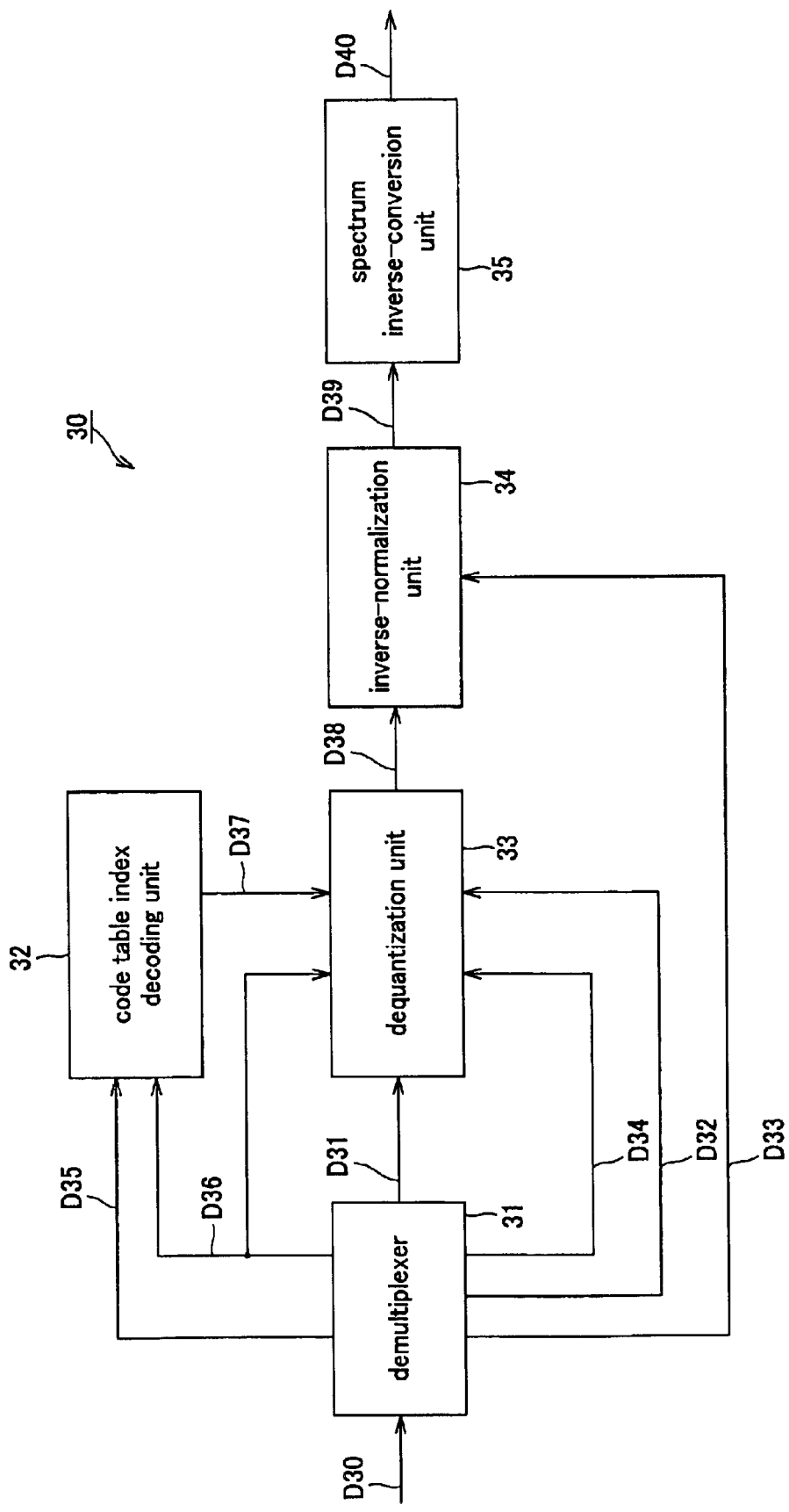
FIG. 10 shows a block diagram of the decoding apparatus according to the present invention.

FIG. 10 shows a block diagram of a decoding apparatus 30 according to the present invention for decoding encoded data output from the encoding apparatus 10. As shown in FIG. 10, the decoding apparatus 30 includes a demultiplexer 31, a code table index decoding unit 32, a dequantization unit 33, an inverse-normalization unit 34, and a spectrum inverse-conversion unit 35.

The demultiplexer 31 decodes and demultiplexes input encoded data D30 into coefficient data D31, quantization accuracy information D32, normalization coefficient D33, group index D34, code table index D35, and code table number index D36. The demultiplexer 31 sends the coefficient data D31 to the dequantization unit 33, and sends the quantization accuracy information D32 and the normalization coefficient D33 to the dequantization unit 33 and to the inverse-normalization unit 34, respectively, after performing decoding processing for those data if necessary. Furthermore, the demultiplexer 31 sends the group index D34 and the code table index D35 to the dequantization unit 33 and to the code table index decoding unit 32, respectively. Yet, furthermore, the demultiplexer 31 sends the code table number index D36 to the code table index decoding unit 32 as well as to the dequantization unit 33.

The code table index decoding unit 32 decodes the code table index D35 based on the code table number index D36, and sends thus decoded index D37 to the dequantization unit 33.

The dequantization unit 33 determines a code table to be used based on the group index D34, code table number index D36, and index D37 sent from the code table index decoding unit 32, and decodes the coefficient data D31 using thus determined code table. Then, the dequantization unit 33 dequantizes obtained quantization coefficients using a quantization step corresponding to the quantization accuracy information D32 sent from the demultiplexer 31 to generate normalized data D38. The dequantization unit 33 sends the normalized data D38 to the inverse-normalization unit 34.

The inverse-normalization unit 34 decodes the normalized data D38 by multiplying the normalized data D38 by a value corresponding to the normalization coefficient D33 sent from the demultiplexer 31, and sends thus obtained spectrum signal D39 to the spectrum inverse-conversion unit 35.

The spectrum inverse-conversion unit 35 performs spectrum inverse-conversion such as the IMDCT (Inverse Modified Discrete Cosine Transformation) for the spectrum signal D39 sent from the inverse-normalization unit 34 to restore an original audio signal D40.

As in the above, the encoding apparatus 10 in above-described embodiments selects a group of code tables from a plurality of groups of code tables according to the property such as tonality of the spectrum signal D11, and encodes quantization coefficients using a code table included in the selected group. Thus, optimum code tables can be selected according to signal property of various input signals without increasing the number of encoding bits to encode indexes of code tables. Furthermore, in case resources for an encoder is small, and sound quality may have to be somewhat degraded so as to realize practical encoding speed, the encoding apparatus 10 can realize high speed encoding by reducing the number of code tables that are to be actually used for encoding.

On the other hand, the decoding apparatus 30 in above-described embodiments selects a code table corresponding to that of the encoding side based on the group index D34, code table index D35, and code table number index D36, which are included in the encoded data D30, to decode the coefficient data D31.

The invention is not limited to above-described embodiments, but various modifications, alternative constructions or equivalents can be implemented without departing from the scope and spirit of the present invention.

For example, above-described embodiments are explained using hardware configuration. On the other hand, the present invention is not limited the configuration, and arbitrary processing may be carried out by a CPU (Central Processing Unit) using a computer program. In this case, the computer program may be provided using a recording medium, or may be provided through the internet or other transmission media.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

Industrial Applicability

As in the above, according to the present invention, optimum code tables can be selected according to signal property, such as tonality, of various input signals without increasing the number of encoding bits to encode indexes of the code tables.

What is claimed is:

1. An encoding method for encoding a digital signal using a single code table in respective predetermined units, comprising the steps of:
    providing a plurality of code tables classified into groups;
    identifying a property of the digital signal;
    a selection step of selecting a single group of code tables from said plurality of groups of code tables according to the property of the digital signal;
    a determination step of determining a single code table from said single group of code tables selected in the selection step; and
    an encoding step of encoding the digital signal using said code table determined in the determination step.

2. The encoding method as set forth in claim 1, wherein the digital signal has undergone frequency conversion.

3. The encoding method as set forth in claim 2, wherein, in the selection step, a group of code tables is selected according to tonality of the digital signal.

4. The encoding method as set forth in claim 1, wherein, in the selection step, a single group of code tables is selected in the respective plural predetermined units.

5. The encoding method as set forth in claim 1, wherein, in the encoding step, an index indicative of a group of code tables selected in the selection step is further encoded.

6. An encoding method for encoding a digital signal using a single code table in respective predetermined units, comprising the steps of:
    a set-up step of setting up a number of selectable code tables classified into a plurality of code tables;
    a step of selecting one of the groups of code tables as containing a code table to be used;
    a selection step of selecting a single code table from a group of code tables; and
    an encoding step of encoding the digital signal using a code table selected in the selection step.

7. The encoding method as set forth in claim 6, wherein, in the encoding step, an index of a code table selected in the selection step is encoded under variable codeword length coding.

8. The encoding method as set forth in claim 6, wherein, in the encoding step, the number of selectable code tables set up in the set-up step is further encoded.

9. The encoding method as set forth in claim 6, wherein, in the set-up step, the number of selectable code tables is set up based on a predetermined set-up signal.

10. An encoding apparatus for encoding a digital signal using a single code table in respective predetermined units, comprising:
    identifying means for identifying the property of the digital signal;
    selection means for selecting a single group of code tables from a plurality of previously classified groups of code tables according to the property of the digital signal;
    determination means for determining a single code table from the group of code tables selected by the selection means; and
    encoding means for encoding the digital signal using the code table determined by the determination means.

11. The encoding apparatus as set forth in claim 10, wherein the digital signal is a signal resulting from a frequency conversion process.

12. The encoding apparatus as set forth in claim 11, wherein the selection means selects the group of code tables according to tonality of the digital signal.

13. The encoding apparatus as set forth in claim 10, wherein the selection means selects a single group of code tables in the respective plural predetermined units.

14. The encoding apparatus as set forth in claim 10, wherein the encoding means further encodes an index indicative of the group of code tables selected by the selection means.

15. An encoding apparatus for encoding a digital signal using a single code table in respective predetermined units, comprising:
    identifying means for identifying the property of the digital signal;
    set-up means for setting up the number of selectable code tables classified into groups of code tables;
    selection means for selecting one of the programs of code tables and then a single code table from the group of code tables; and
    encoding means for encoding the digital signal using the code table selected by the selection means.

16. The encoding apparatus as set forth in claim 15, wherein the encoding means encodes an index of the code table selected by the selection means under variable codeword length coding.

17. The encoding apparatus as set forth in claim 15, wherein the encoding means further encoded the number of selectable code tables set up by the set-up means.

18. The encoding apparatus as set forth in claim 15, wherein the set-up means sets up the number of selectable code tables based on the predetermined set-up signal.

19. A program for making a computer carry out an encoding processing of encoding a digital signal using a single code table in respective predetermined units, the processing comprising the steps of:
    identifying a property of the digital signal;
    a selection step of selecting, according to the property of the digital signal, a single group of code tables from a plurality of groups of code tables classified in advance;
    a determination step of determining a single code table from a group of code tables selected in the selection step; and an encoding step of encoding the digital signal using a code table determined in the determination step.

20. A program for making a computer carry out an encoding processing of encoding a digital signal using a single code table in respective predetermined units, the processing comprising the steps of:
- a set-up step of setting up the number of selectable code tables classified into groups of code tables;
- a selection step of selecting one of said groups of code tables and then a single code table from a group of code tables; and
- an encoding step of encoding the digital signal using a code table selected in the selection step.

21. A recording medium having recorded therein a program which can be read out by a computer, the program making a computer carry out an encoding processing of encoding a digital signal using a single code table in respective predetermined units, the processing comprising the steps of:
- providing a plurality of code tables classified into groups;
- identifying a property of the digital signal;
- a selection step of selecting a single group of code tables from said plurality of groups of code tables according to the property of the digital signal;
- a determination step of determining a single code table from said single group of code tables selected in the selection step; and
- an encoding step of encoding the digital signal using said code table determined in the determination step.

22. A recording medium having recorded therein a program which can be read out by a computer, the program making a computer carry out an encoding processing of encoding a digital signal using a single code table in respective predetermined units, the processing comprising the steps of:
- a set-up step of setting up the number of selectable code tables classified into groups of code tables;
- a selection step of selecting one of said groups of code tables and then a single code table from a group of code tables; and
- an encoding step of encoding the digital signal using a code table selected in the selection step.

23. A decoding method for decoding a digital signal that has been encoded using a single code table in respective predetermined units, comprising the steps of:
- providing a plurality of code tables classified into groups;
- a selection step of selecting a single group of code tables to be used from said plurality of groups of code tables;
- a determination step of determining a single code table to be used from said single group of code tables selected in the selection step; and
- a decoding step of decoding the digital signal using said code table determined in the determination step.

24. The decoding method as set forth in claim 23, wherein the digital signal has undergone frequency conversion.

25. The decoding method as set forth in claim 24, wherein, in the selection step, a group of code tables, being the same as what has been selected according to tonality of the digital signal in encoding the digital signal, is selected.

26. The decoding method as set forth in claim 23, wherein, in the selection step, a single group of code tables is selected in the respective plural predetermined units.

27. The decoding method as set forth in claim 23, wherein, in the selection step, a group of code tables is selected based on an index indicative of a used group of code tables.

28. A decoding method for decoding a digital signal that has been encoded using a single code table in respective predetermined units, comprising the steps of:
- a set-up step of setting up the number of code tables classified into groups of code tables;
- a step of selecting one of the groups of code tables;
- a selection step of selecting a single code table from a group of code tables; and
- a decoding step of decoding the digital signal based on a code table selected in the selection step.

29. The decoding method as set forth in claim 28, wherein, in the selection step, a code table to be used is selected based on an index of the code table which has been encoded under variable codeword length coding.

30. The decoding method as set forth in claim 28, wherein, in the set-up step, the number of code tables is set up based on the number of code tables which has been encoded together with the digital signal.

31. A decoding apparatus for decoding a digital signal that has been encoded using a single code table in respective predetermined units, comprising:
- selection means for selecting a single group of code tables to be used from a plurality of previously classified groups of code tables;
- determination means for determining a single code table to be used from the group of code tables selected by the selection means; and
- decoding means for decoding the digital signal using the code table determined by the determination means.

32. The decoding apparatus as set forth in claim 31, wherein the digital signal is a signal resulting from a frequency conversion process.

33. The decoding apparatus as set forth in claim 32, wherein the selection means selects the group of code tables being the same as what has been selected according to tonality of the digital signal in encoding the digital signal.

34. The decoding apparatus as set forth in claim 31, wherein the selection means selects a single group of code tables in the respective plural predetermined units.

35. The decoding apparatus as set forth in claim 31, wherein the selection means selects a group of code tables based on an index indicative of the used group of code tables.

36. A decoding apparatus for decoding a digital signal that has been encoded using a single code table in respective predetermined units, comprising:
- a set-up means for setting up the number of code tables classified into groups of code tables;
- a selection means for selecting one of the groups of code tables and then a single code table from a group of code tables; and
- a decoding means for decoding the digital signal based on a code table selected by the selection means.

37. The decoding apparatus as set forth in claim 36, wherein the selection means selects a code table to be used based on an index of a code table which has been encoded under variable codeword length coding.

38. The decoding apparatus as set forth in claim 36, wherein the set-up means sets up the number of code tables based on the number of code tables which has been encoded together with the digital signal.

39. A program for making a computer carry out a decoding processing of decoding a digital signal that has been encoded using a single code table in respective predetermined units, the processing comprising the steps of:

a selection step of selecting a single group of code tables to be used from a plurality of groups of code tables classified in advance;

a determination step of determining a single code table to be used from a group of code tables selected in the selection step; and a decoding step of decoding the digital signal using a code table determined in the determination step.

40. A program for making a computer carry out a decoding processing of decoding a digital signal that has been encoded using a single code table in respective predetermined units, the processing comprising the steps of:

a set-up step of setting up the number of code tables classified into groups of code tables;

a selection step of selecting one of the groups of code tables and then a single code table from a group of code tables; and a decoding step of decoding the digital signal based on a code table selected in the selection step.

41. A recording medium having recorded therein a program which can be read out by a computer, the program making a computer carry out a decoding processing of decoding a digital signal that has been encoded using a single code table in respective predetermined units, the processing comprising the steps of:

providing a plurality of code tables classified into groups;

a selection step of selecting a single group of code tables to be used from said plurality of groups of code tables;

a determination step of determining a single code table to be used from said single group of code tables selected in the selection step; and a decoding step of decoding the digital signal using said code table determined in the determination step.

42. A recording medium having recorded therein a program which can be read out by a computer, the program making a computer carry out a decoding processing of decoding a digital signal that has been encoded using a single code table in respective predetermined units, the processing comprising the steps of:

a set-up step of setting up the number of code tables classified into groups of code tables;

a selection step of selecting one of the groups of code tables and then a single code table from a group of code tables; and a decoding step of decoding the digital signal based on a code table selected in the selection step.

* * * * *